United States Patent
Shiga et al.

(10) Patent No.: US 6,974,996 B2
(45) Date of Patent: Dec. 13, 2005

(54) SEMICONDUCTOR DEVICE AND METHOD OF MANUFACTURING THE SAME

(75) Inventors: Tomofusa Shiga, Nukata-gun (JP); Takaaki Aoki, Okazaki (JP); Yoshifumi Okabe, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/726,590

(22) Filed: Dec. 4, 2003

(65) Prior Publication Data

US 2004/0145012 A1 Jul. 29, 2004

(30) Foreign Application Priority Data

Jan. 23, 2003 (JP) .............................. 2003-014466

(51) Int. Cl.[7] ............................................. H01L 29/76

(52) U.S. Cl. ..................... 257/330; 357/23.6; 257/304; 257/382; 257/900; 365/149; 437/47; 438/243

(58) Field of Search ....................... 357/23.6, 257/304, 257/382, 900, E21.166, E21.651, E27.092; 365/149; 437/47; 438/243

(56) References Cited

U.S. PATENT DOCUMENTS

| 4,785,337 A | * | 11/1988 | Kenney ....................... 257/304 |
| 4,833,094 A | * | 5/1989 | Kenney ....................... 438/243 |
| 5,321,289 A | | 6/1994 | Baba et al. |
| 5,972,800 A | | 10/1999 | Hasegawa |
| 6,037,651 A | | 3/2000 | Hasegawa |
| 6,469,345 B2 | | 10/2002 | Aoki et al. |
| 6,624,044 B2 | * | 9/2003 | Ito et al. ...................... 438/425 |
| 6,784,471 B2 | * | 8/2004 | Nakabayashi ................ 257/288 |
| 2002/0167046 A1 | | 11/2002 | Aoki et al. |

FOREIGN PATENT DOCUMENTS

| JP | A-2000-196074 | 7/2000 |
| JP | A-2003-224274 | 8/2003 |

* cited by examiner

*Primary Examiner*—David Nelms
*Assistant Examiner*—Mai-Huong Tran
(74) *Attorney, Agent, or Firm*—Posz Law Group, PLC

(57) ABSTRACT

In a semiconductor device having a trench-gate structure in which polysilicon doped with boron is embedded in a trench, insulating film formed on the inner wall of the trench comprises ONO film, and silicon nitride film constituting the ONO film is formed to such film thickness and film quality that boron can be suppressed from passing through the silicon nitride film. Silicon oxide film is formed so that a top oxide film is thin and a bottom oxide film is thick.

12 Claims, 3 Drawing Sheets

SEMICONDUCTOR DEVICE AND METHOD OF MANUFACTURING THE SAME

CROSS REFERENCE TO RELATED APPLICATION

This application is based upon, claims the benefit of priority of, and incorporates by reference the contents of Japanese Patent Application No. 2003-14466 filed on Jan. 23, 2003.

BACKGROUND OF THE INVENTION

1. Field of the Invention

The present invention relates to a semiconductor device and a manufacturing method therefore and, more particularly, to a semiconductor device having a trench gate structure and a manufacturing method therefore.

2. Description of the Related Art

Semiconductor devices having a trench gate structure in which gate insulating film is formed on a side wall of a trench formed in one surface of a semiconductor substrate and in which a gate electrode is embedded in the trench are known.

In some of the semiconductor devices as described above, the gate insulating film comprises laminate film formed of silicon oxide film, silicon nitride film and silicon oxide film, referred to as ONO (Oxide Nitride Oxide) film. By forming the gate insulating film of the ONO film, each of these semiconductor devices has a higher gate withstand voltage than a semiconductor device whose gate insulating film is formed of only silicon oxide film (for example, JP-A-2001-196587).

Furthermore, in a process of manufacturing a semiconductor device having a trench gate structure as described above, a gate electrode is generally formed of polysilicon doped with impurities such as B (boron), P (phosphorous) or the like. After the gate electrode is formed, interlayer insulating film is formed on the gate electrode, and a heat treatment is carried out to flatten the interlayer insulating film. When an impurity diffused layer for a source region or the like is form ed after the gate electrode is formed, ion implantation is conducted to form a source region and etc. after the gate electrode is formed, and a heat treatment is conducted to diffuse the impurities.

In the manufacturing process described above, particularly when P$^+$-type polysilicon doped with boron is used as a gate electrode, when the heat treatment is conducted after the formation of the gate electrode, boron contained in the gate electrode may be diffused into the gate insulating film. Accordingly, the film quality of the gate insulating film is deteriorated, which may result in a withstanding voltage of the gate insulating film that is lower than a set value.

SUMMARY OF THE INVENTION

Therefore, the present invention has been implemented in view of the foregoing description, and has an object to provide a semiconductor device that can suppress reduction in withstand voltage of insulating film formed on a side wall of a trench in a semiconductor device having a trench-gate structure in which polysilicon doped with boron is embedded in the trench, and a method of manufacturing the semiconductor device.

In order to attain the above object, according to a first aspect of the present invention, a semiconductor device having a trench-gate structure in which laminate film is formed on a side wall of a trench and polysilicon doped with boron is embedded in the trench, is characterized in that silicon nitride film in the laminate film has a predetermined film thickness and film quality sufficient for suppressing passage of boron therethrough, and the film thickness of first silicon oxide film at the trench side in the laminate film is set to be larger than the film thickness of second silicon oxide film at the polysilicon side.

According to the semiconductor device of the first aspect, the silicon nitride film of the laminate film formed on the side wall of the trench is formed to have the film thickness and the film quality under the condition of which boron can be suppressed from passing through the silicon nitride film. Therefore, boron contained in polysilicon can be suppressed from diffusing into the first silicon oxide film at the trench side.

Furthermore, since the first silicon oxide film at the trench side is set to be larger than the film thickness of the second silicon oxide film at the polysilicon side, the rate of a boron-unpolluted area to the overall laminate film can be increased as compared with a case where the film thickness of the second silicon oxide film is set to be larger than the film thickness of the first silicon oxide film. Therefore, according to this invention, the withstand voltage of the laminate film can be suppressed from being reduced due to diffusion of boron as compared with the case where the film thickness of the second silicon oxide film is larger than that of the first silicon oxide film.

The invention of the first aspect is applicable to a semiconductor device including a transistor having a P-channel type trench-gate structure, for example.

According to a second aspect of this invention, a method of manufacturing a semiconductor device having a trench-gate structure in which polysilicon doped with boron is embedded in a trench, is characterized by forming first silicon oxide film on a side wall of the trench so that the film thickness of the first silicon oxide film is larger than the film thickness of second silicon oxide film at the polysilicon side; forming silicon nitride film on the first silicon oxide film so that the silicon nitride film has such film thickness and film quality sufficient for suppressing boron from passing through the silicon nitride film; and forming second silicon oxide film on the silicon nitride film so that the film thickness of the second silicon oxide film is smaller than the film thickness of the first silicon oxide film at the trench side, thereby forming laminate film.

According to this manufacturing method, the semiconductor device according to the first aspect of this invention can be manufactured.

Furthermore, according to this invention, in the step of forming the silicon oxide film at the trench side, laminate film having a desired withstand voltage can be formed by setting the withstand voltage of the overall laminate film on the basis of the silicon oxide film at the trench side.

The invention of the second aspect is applicable to the method of manufacturing a semiconductor device including a transistor having a P-channel type trench-gate structure, for example.

DETAILED DESCRIPTION OF THE PREFERRED EMBODIMENTS

Preferred embodiments according to this invention will be described hereunder with reference to the accompanying drawings.

(First Embodiment)

Figure 1:
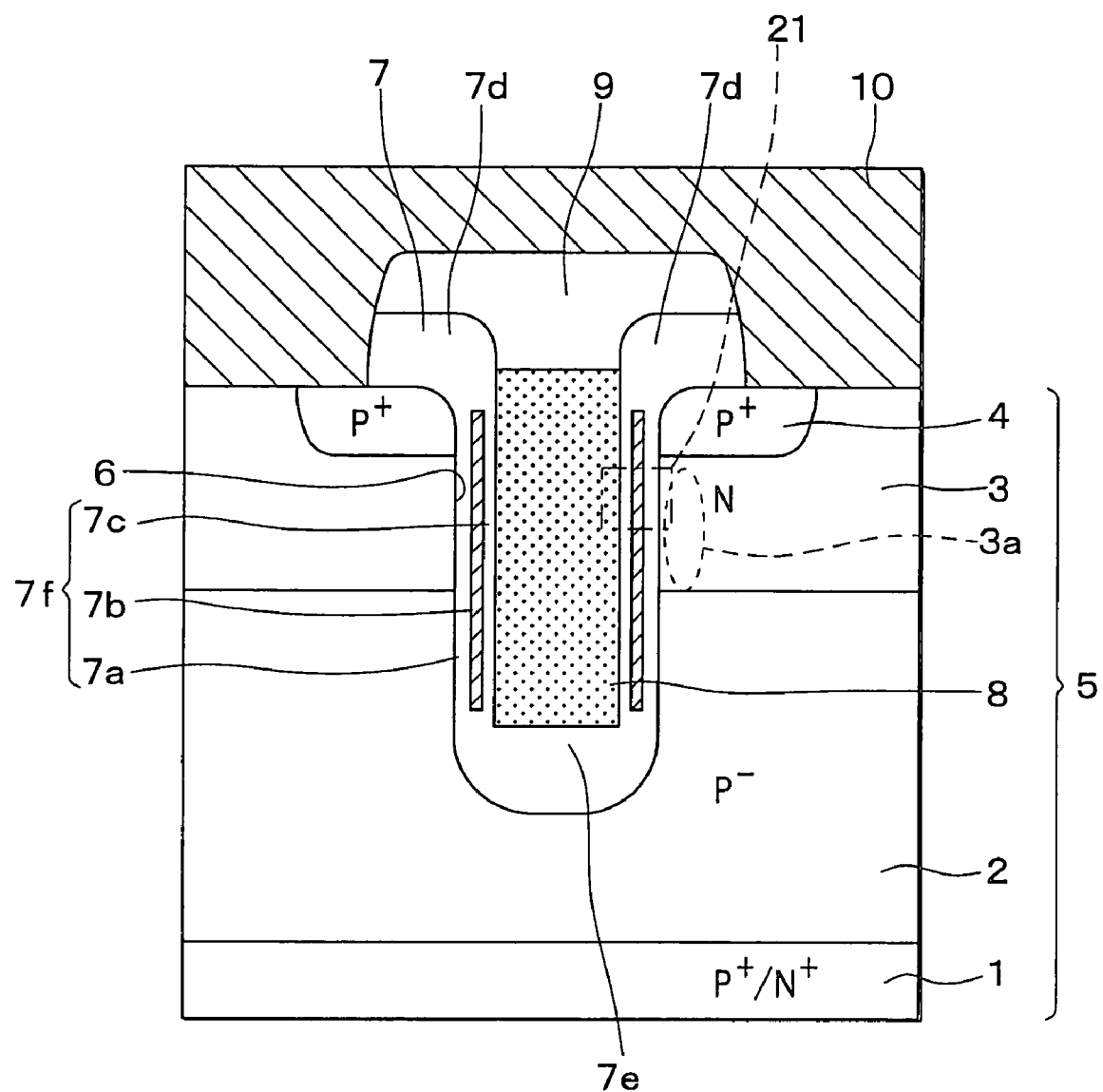
FIG. 1 is a cross-sectional view showing a semiconductor device according to an embodiment of this invention.

FIG. 1 is a cross-sectional view showing a semiconductor device implemented according to an embodiment of the present invention. This semiconductor device if for implementing a transistor having a trench-gate structure such as a power MOSFET, IGBT or the like. A preferred embodiment will be described with respect to a P-channel type transistor.

In FIG. 1, a P-type drift layer 2 is formed on a P+-type or N+-type silicon substrate 1, and an N-type layer 3 serving as a base region is formed on the drift layer 2. A P+-type layer 4 serving as a source region is formed in the N-type layer 3. A semiconductor substrate 5 comprises these elements.

Furthermore, a trench 6 is formed in one surface of the semiconductor substrate 5 so as to penetrate through the P+-type layer 4 and the N-type layer 3, and to reach the drift layer 2. Gate insulating film 7 is formed on the inner wall of the trench 6. A gate electrode 8 is further embedded through the gate insulating film 7 in the trench 6.

The gate insulating film 7 comprises ONO film 7f formed on the side wall portion of the trench 6, and silicon oxide film 7d, 7e formed on the upper and bottom portions of the trench 6.

Furthermore, the ONO film 7 comprises a first silicon oxide film 7a at the side of the trench 6, silicon nitride film 7b and second silicon oxide film 7c at the side of the gate electrode 8. In the following description, the first silicon oxide film 7a at the trench side will be referred to as a "bottom oxide film" and the second silicon oxide film 7c at the gate electrode side will be referred to as a "top oxide film".

The silicon nitride film 7b is designed to have a sufficient film thickness and film quality for preventing boron from passing through the silicon nitride film 7b. Specifically, the film thickness may be set to, for example, 10 to 30 nm. Furthermore, the silicon nitride film 7b is formed so that the upper end thereof is located above the boundary between the N-type layer 3 and the P+-type layer 4, and particularly at one surface side of the semiconductor substrate 5.

The film thickness of the bottom oxide film 7a is set to, for example, about 100 nm and the film thickness of the top oxide film 7c is set to, for example, 10 to 30 nm. As described above, the film thickness of the bottom oxide film 7a is set to be larger than the film thickness of the top oxide film 7c.

Furthermore, the film thickness of the silicon oxide film 7d, 7e formed on the upper and lower portions of the trench 6 is set to be larger than the film thickness of the ONO film 7f formed on the side wall portion of the trench 6. Here, the upper portion of the trench 6 corresponds to a portion containing the corner portion at the upper side of the trench 6, and the bottom portion of the trench 6 corresponds to a portion containing the corner portion at the bottom side of the trench 6.

The gate electrode 8 is formed of polysilicon doped with boron. BPSG film 9 is formed on one surface of the N-type layer 3 serving as a base region and one surface of the P+-type layer 4 serving as a source region. Particularly, the BPSG film 9 is formed on the surface of the semiconductor substrate 5. A source electrode 10 and metal film serving as gate and collector electrodes (not shown in FIG. 1) are formed through a contact hole formed in the BPSG film 9.

By constructing the semiconductor device as described above, a transistor is achieved having a trench-gate structure in which the ONO film 7f, etc. formed on the inner wall of the trench 6 are set as gate insulating film 7, and an area in the neighborhood of the side wall of the trench 6 in the N-type layer is set as a channel region 3a.

Here, the ONO film 7f comprised of the bottom oxide film 7a, the silicon nitride film 7b and the top oxide film 7c is formed on the side wall portion of the trench 6 in the gate insulating film 7. Therefore, a higher gate withstand voltage is achieved as compared with the case when the gate insulating film on the side wall portion of the trench 6 is formed of only the silicon oxide film. Furthermore, the silicon oxide film 7d, 7e is formed on the upper and bottom portions of the trench 6 respectively so that the thickness thereof is larger than the laminate film formed on the side wall of the trench 6. Therefore, the concentration of electric field at the upper and lower corner portions of the trench 6 is moderated, so that the withstand voltage can be prevented from being reduced at the corner portions due to the concentration of electric field.

Next, a method of manufacturing the semiconductor device as described above will be described with reference to FIGS. 2A to 2H.

Figure 2A:
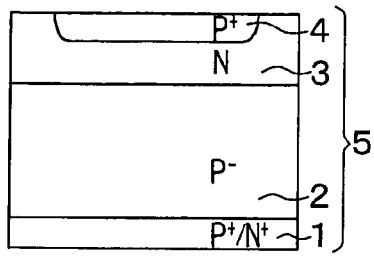
FIGS. 2A to 2H are cross-sectional views showing a process of manufacturing the semiconductor device shown in FIG. 1.

First, in the step shown in FIG. 2A, the P-type drift layer 2 is formed on the P+-type or N+-type silicon substrate 1, and then the N-type layer 3 serving as the base region and the P+-type layer 4 serving as the source region are successively formed by ion implantation and a heat treatment for diffusing impurities. At this time, the depth of the N-type layer 3 is set to 2 to 3 μm, and the depth of the P+-type layer 4 is set to about 0.5 μm.

Figure 2B:
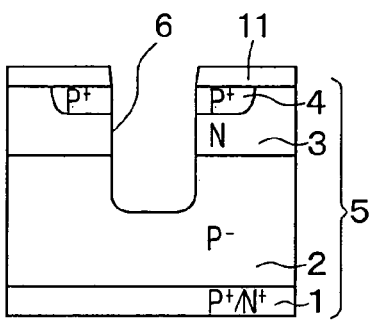

Subsequently, in the step shown in FIG. 2B, the silicon oxide film 11 serving as a trench mask is deposited at a thickness of about 0.5 μm by the CVD method, and patterning is conducted by using photolithography and anisotropic dry etching. Subsequently, the trench 6 is formed with the patterned silicon oxide film 11 as a mask by anisotropic dry etching so as to penetrate through the P+-type layer 4 and the N-type layer 3 and reach the drift layer 2. At this time, the depth of the trench 6 is approximately 2 to 6 μm.

Figure 2C:
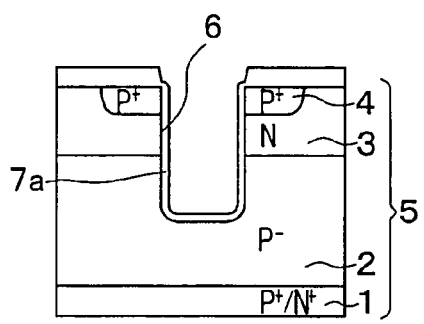

Subsequently, in the step shown in FIG. 2C, the surface of the inner wall constituting the trench 6 is isotropically etched and removed by about 0.1 μm by chemical dry etching using gas of $CF_4$ and $O_2$. Thereafter, a sacrificial layer of oxide film of about 100 nm in thickness is formed under atmosphere of $H_2O$ or $O_2$ by thermal oxidation. Thereafter, the sacrificial layer is removed by wet etching using rare hydrofluoric acid. At this time, the oxide film 11 for the trench mask is simultaneously etched. The wet etching time may be set to the time needed to remove only the sacrificial layer or the time needed to remove both the sacrificial layer and the silicon oxide film 11 for the trench mask. Subsequently, the first silicon oxide film 7a serving as the bottom oxide film is formed on the inner wall of the trench 6 so that the film thickness thereof is larger than the film thickness of the top oxide film 7c (see FIG. 1) formed later. Specifically, the silicon oxide film 7a is formed by thermal oxidation under $H_2O$ or $O_2$ atmosphere so that the film thickness thereof is equal to about 100 nm.

Figure 2D:
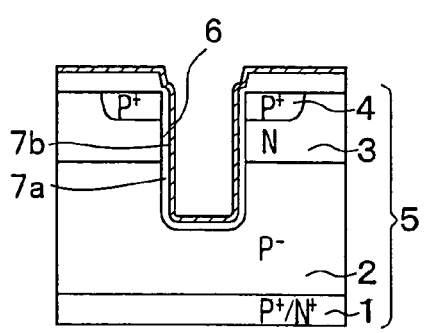

Subsequently, in the step shown in FIG. 2D, the silicon nitride film 7b is formed to have a film thickness and film quality sufficient for suppressing boron from passing through the silicon nitride film 7b, so that boron contained in the gate electrode 8 which will be formed later can be suppressed from diffusing into the bottom oxide film 7a. Specifically, the film thickness of the silicon nitride film 7b is set to 10 to 30 nm.

The silicon nitride film 7b may be formed by thermal oxidation under $N_2$ atmosphere. A comparison between the method of forming the silicon nitride film 7b by the CVD method and the method of forming the silicon nitride film 7b under $N_2$ atmosphere by the thermal oxidation demonstrates that the former method can more easily provide thick silicon nitride film 7b than the latter method when the silicon nitride film 7 having the same film thickness is formed. Therefore, the silicon nitride film 7b is preferably formed by the former method.

Figure 2E:
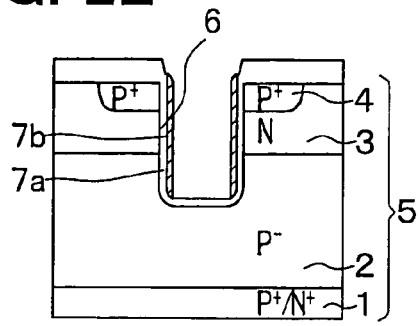

Subsequently, in the step shown in FIG. 2E, anisotropic dry etching using $CHF_3$ and $O_2$ type gas is performed so that the silicon nitride film at the side wall portion of the trench 6 is left, and the silicon nitride film at the bottom portion of the trench 6 is removed, thereby exposing the first silicon oxide film 7a. At this time, the upper portion of the trench 6 and the silicon nitride film formed on the silicon oxide film 11 on the surface of the substrate are removed at the same time, and the first silicon oxide film 7a is also exposed.

Figure 2F:
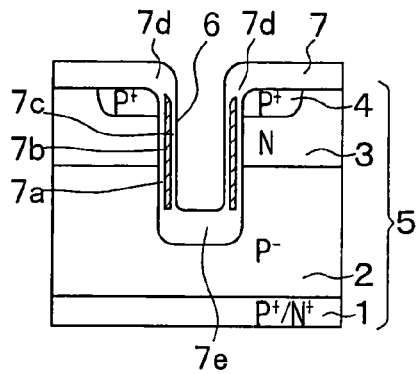

In the step shown in FIG. 2F, the second silicon oxide film 7c serving as the top oxide film is formed on the silicon nitride film 7b so that the film thickness thereof is smaller than the film thickness of the first silicon oxide film 7a. Specifically, the thermal oxidation is carried out under $H_2O$ or $O_2$ atmosphere at 950° C. to form the second silicon oxide film 7c of 5 to 10 nm.

As described above, the ONO film 7f comprised of the bottom oxide film 7a, the silicon nitride film 7b and the top oxide film 7c is formed on the side wall portion of the trench 6. Furthermore, the silicon oxide film 7d, 7e of about 200 nm in thickness which is increased in thickness by the thermal oxidation is formed on the upper and bottom portions of the trench 6 from which the silicon nitride film is removed. Accordingly, the concentration of electric field at the corner portions of the upper and bottom portions of the trench 6 can be moderated, so that the withstand voltage can be prevented from being lowered due to the concentration of electric field on the gate insulating film 7 at the corner portions.

Figure 2G:
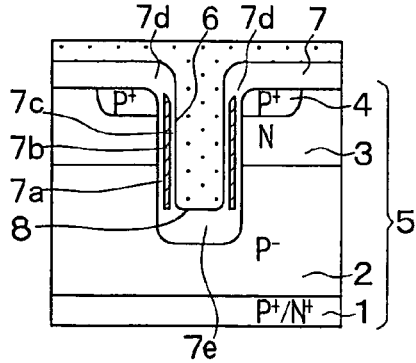

Subsequently, in the step shown in FIG. 2G, polysilicon 8 doped with boron is formed on the surface of the semiconductor substrate 5, containing the inside of the trench 6, by the LPCVD method, so that polysilicon 8 doped with boron is filled in the trench 6. Subsequently, polysilicon 8 is etched back to a desired thickness.

Figure 2H:
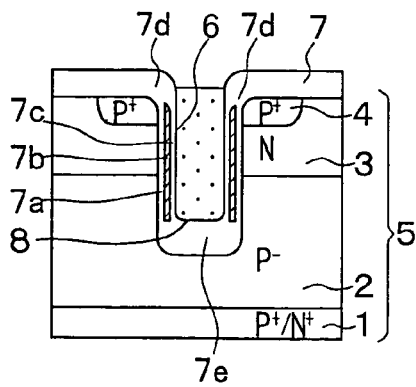

Subsequently, in the step shown in FIG. 2H, polycrystal silicon 8 is patterned by photolithography to form the gate electrode 8.

Thereafter, as shown in FIG. 1, the BPSG film 9 serving as interlayer insulating film is formed by the plasma CVD method, and a heat treatment is conducted to flatten the surface of the BPSG film 9. Furthermore, a contact hole is formed by photolithography and anisotropic dry etching, and meta 1 film serving as source, gate and collector electrodes is formed by the sputtering method. As described above, the semiconductor device shown in FIG. 1 is manufactured.

Some of the advantages of this embodiment will now be discussed. When the $P^+$-type polysilicon doped with boron is used as the gate electrode, boron contained in the gate electrode 8 is diffused into the top oxide film 7c and the silicon nitride film 7b by the thermal treatment for flattening the BPSG film 9 which is carried out after the step of forming the gate electrode 8 of FIG. 2H.

In the prior art, there has been the disadvantage that boron passes through the silicon nitride film 7b and diffuses into the bottom oxide film 7a or the channel region 3a under some conditions of film thickness and film quality of the silicon nitride film 7b. Therefore, there has been a risk that the withstand voltage of the gate insulating film 7 will be lowered due to deterioration of the film quality of the gate insulating film 7 or the concentration of impurities of the channel region 3a is varied, so that the threshold voltage is varied from the predetermined value.

However, according to this embodiment, in the ONO film 7f formed on the side wall portion of the trench 6, the film thickness and film quality of the silicon nitride film 7b are set so that boron can be prevented from passing through the silicon nitride film 7b.

Accordingly, the diffusion of boron contained in the gate electrode 8 due to the thermal treatment conducted on the BPSG film 9 after the formation of the gate electrode 8 can be prevented by the silicon nitride film 7b. Therefore, diffusion of boron into the bottom oxide film 7a and the channel region 3a can be prevented. Accordingly, reduction of the withstand voltage of the gate insulating film and variation of the impurity concentration of the channel region 3a can be suppressed, whereby the withstand voltage and threshold voltage of the gate insulating film 7 can be prevented from being varied from the set values.

Figure 3:
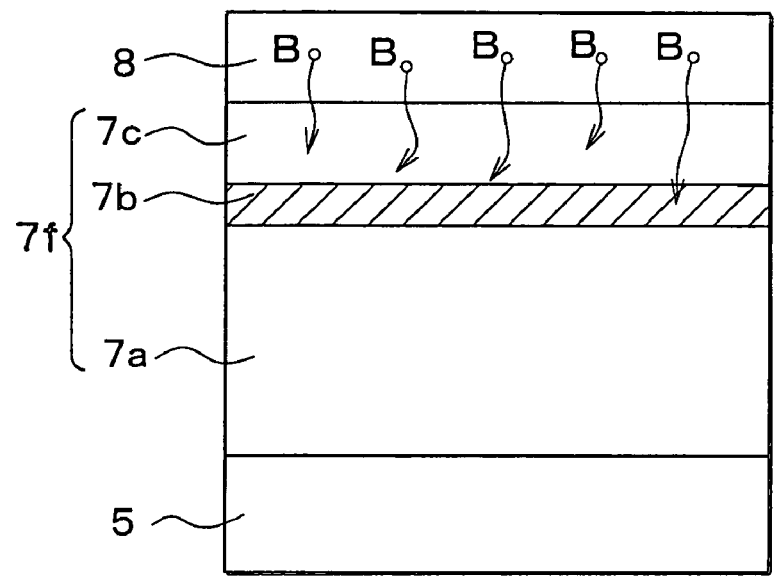
FIG. 3 is an enlarged diagram showing an area 21 in FIG. 1.
Figure 4:
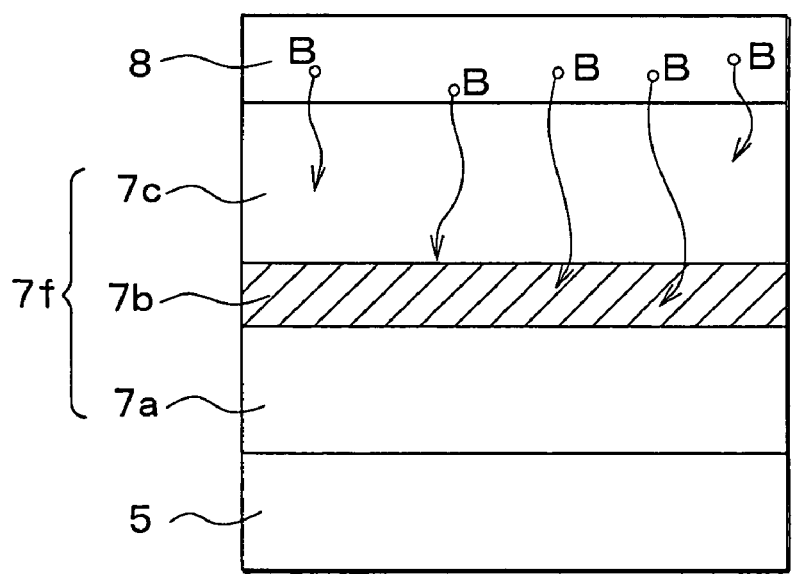
FIG. 4 is a diagram showing an example in which the withstand voltage of gate insulating film 7 is lower than that of FIG. 3.

FIG. 3 is an enlarged view showing an area 21 indicated by a one-dotted chain line of FIG. 1. FIG. 3 is a diagram in which the area 21 is rotated by 90 degrees, and shows the gate electrode 8, the ONO film 7f and the semiconductor substrate 5 which are viewed from the upper side. To the contrary, FIG. 3, FIG. 4 is a diagram when the top oxide film 7c is larger in thickness than that of the bottom oxide film 7a.

In this embodiment, as shown in FIG. 3, the silicon oxide film of the ONO film 7f is formed so that the top oxide film 7c is thin and the bottom oxide film 7a is thick. Therefore, as compared with the case where the top oxide film 7c is larger in thickness than the bottom oxide film 7a as shown in FIG. 4, the rate of the boron-diffusing area to the overall ONO film 7f can be reduced. Particularly, the diffusion of boron into the overall ONO film 7f can be effectively suppressed.

Accordingly, if the film thickness of the bottom oxide film 7a is set to be larger than that of the top oxide film 7c in the ONO film 7f, the area in which the film quality is deteriorated due to boron diffusion caused by the thermal treatment after the formation of the gate electrode 8 could be more remarkably reduced as compared with the case where the film thickness of the top oxide film 7c is set to be larger than the film thickness of the bottom oxide film 7a. Therefore, the withstand voltage at the side wall of the gate insulating film 7 can be suppressed from being lower than the set value.

In this embodiment, the area polluted by diffusion of boron is reduced. Accordingly, it is preferable to set the film thicknesses of the bottom oxide film 7a, etc. so that the withstand voltage of the bottom oxide film 7a for which boron diffusion is suppressed is equal to a target withstand voltage of the overall ONO film 7.

As described above, according to this embodiment, the silicon oxide film 7d, 7e having a large film thickness is formed as the gate insulating film 7 at the upper and bottom portions of the trench 6, so that the withstand voltage of the gate insulating film 7 at the upper and bottom portions of the trench 6 can be enhanced. Furthermore, the withstand voltage of the gate insulating film 7 at the side wall portion of the trench 6 can be enhanced by forming the ONO film 7f on the side wall portion of the trench 6 as described above.

(Second Embodiment)

In the first embodiment as described above, according to the method of manufacturing the trench-gate type semiconductor device, the N-type layer 3 serving as the base region and the P⁺-type layer 4 serving as the source region are formed before the gate electrode 8 is formed. However, after the gate electrode 8 is formed, the N-type layer 3 and the P⁺-type layer 4 may be formed by the ion implantation and the thermal treatment to diffuse the impurities.

In this case, the manufacturing process is altered as follows. More particularly, the formation of the N-type layer 3 and the P⁺-type layer 4 is not carried out in the step of FIG. 2A out of FIGS. 2A to 2H, and in the step of FIG. 2H, the silicon oxide film 11 on the surface of the area for forming the N-type layer 3 and the P⁺-type layer 4 of the drift layer 2 is removed after the gate electrode is formed. Thereafter, the N-type layer 3 and the P⁺-type layer 4 are formed by the ion implantation and the impurity diffusion. The other steps shown in FIGS. 2B to 2F in which the gate insulating film 7 is formed, etc. are carried out in the same manner as the first embodiment.

After the N-type layer 3 and the P⁺-type layer 4 are formed, the BPSG film 9 serving as the interlayer insulating film is formed by the plasma CVD method, and further the thermal treatment is carried out to flatten the surface of the BPSG film 9 as shown in FIG. 1. The subsequent steps are carried out in the same manner as the first embodiment to thereby manufacture the semiconductor device.

In this case, there is a risk that boron contained in the gate electrode 8 is diffused to the gate insulating film and the semiconductor substrate 5 by the thermal treatment for diffusing the impurities when the N-type layer 3 and the P⁺-type layer 4 are formed, and the thermal treatment for flattening the BPSG film 9 in the same manner as the first embodiment.

Accordingly, in this embodiment, the ONO film 7f constituting the gate insulating film 7 is formed in the same manner as the first embodiment, thereby effectively suppressing the diffusion of boron from the gate electrode 8 to the gate insulating film 7 due to the thermal treatment for the impurity diffusion after the formation of the gate electrode, the thermal treatment for flattening the BPSG film 9, etc.

(Other Embodiments)

In each of the above-described embodiments, the insulating film at each of the upper and bottom portions of the trench 6 is formed of only the silicon oxide film. However, the insulating film at only one of the upper and bottom portions of the trench may be formed of silicon oxide film while the insulating film at the other portion is formed of ONO film. In order to form silicon oxide film at only one of the upper and bottom portions of the trench, the manufacturing process may be modified so that anisotropic dry etching is carried out while the other silicon nitride film is masked to prevent the silicon nitride film from being removed.

All the gate insulating film 7 may be formed of ONO film. In this case, the manufacturing process may be modified so that the silicon nitride film 7b is not removed and the silicon oxide film 7c is formed on the silicon nitride film 7b.

Furthermore, in each of the above-described embodiments, the semiconductor device has the P-channel type transistor. However, the present invention is applicable to a semiconductor device having an N-channel type transistor in which polysilicon doped with boron is used for the gate electrode and the conduction type of each layer of the semiconductor device is set to the opposite conduction type to the above-described embodiments.

In each of the above-described embodiments, the semiconductor device comprises a transistor such as a power MOSFET, IGBT or the like. However, the present invention is not limited to the transistor, and the present invention is applicable to a semiconductor device having a trench-type capacitor in which polysilicon is embedded in a trench.

In this case, the insulating film formed on the inner wall of the trench is formed of the ONO film, the silicon nitride film constituting the ONO film is formed to have such film thickness and film quality that boron can be suppressed from passing through the silicon nitride film, and the silicon oxide film is formed so that the top oxide film is thin and the bottom oxide film is thick.

By forming the silicon nitride film as described above, diffusion of boron contained in the gate electrode due to the thermal treatment after formation of the electrode gate can be prevented by the silicon nitride film, so that the diffusion of boron into the bottom oxide film can be prevented.

Furthermore, by forming the bottom oxide film and the top oxide film so that the bottom oxide film is larger in thickness than the top oxide film, the area into which boron is diffused can be reduced. Accordingly, the diffusion of boron can be effectively suppressed, so that the withstand voltage of the insulating film formed on the inner wall of the trench can be prevented from being reduced to a value less than the set value.

The boron diffusion suppressing film is not limited to only being implemented within a trench gate semiconductor. Rather, the boron diffusion suppressing film may also be implemented within, for example, a metal oxide semiconductor field effect transistor (MOSFET) between a boron-doped polysilicon gate and a channel region. The boron diffusion suppressing film is preferably comprised of laminate film that is comprised of a first silicon oxide film, silicon nitride film and a second silicon oxide film (7c) successively laminated in this order.

Preferably, a film thickness of the first silicon oxide film at a gate side is thinner then a film thickness of the second silicon oxide film at a channel side. Also, preferably the MOSFET is a P-channel MOSFET.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A vertical MOS device having a trench gate structure, the semiconductor device comprising:
   a semiconductor body having a trench, the trench having an inlet, a sidewall and a bottom;
   a gate insulation film disposed to cover the sidewall and the bottom of the trench, the gate insulation film comprising a laminate structure of a first silicon oxide film, silicon nitride film and a second silicon oxide film successively laminated in this order from a trench side; and a gate electrode of a polycrystalline silicon which is doped with boron, the gate electrode filling the trench with the gate insulation film interposed, wherein:

the semiconductor body has a first region of a first conductivity type, a second region of a second conductivity type, and a third region of the first conductivity type vertically aligned along the trench, and thereby a vertical MOS structure is formed by the gate electrode in the trench, the gate insulation film on the sidewall of the trench, and the first through third region;

the laminate structure of the gate insulation film is disposed to cover at least the second region in the trench;

the silicon nitride film in the laminate structure has a film thickness and film quality sufficient for suppressing boron from passing through the silicon nitride film; and the first silicon oxide film at the trench side in the laminate structure has a film thickness that is greater than a film thickness of the second silicon oxide film at the gate electrode side.

2. The vertical MOS device according to claim 1, wherein the first conductivity type is P-type, the second conductivity type is N-type, and the vertical MOS structure is a P channel type MOSFET.

3. The vertical MOS device according to claim 1, wherein the silicon nitride film in the laminate structure has a film thickness of 10–30 nm.

4. The vertical MOS device according to claim 1, wherein the first silicon oxide film in the laminate structure has a film thickness of approximately 100 nm.

5. The vertical MOS device according to claim 1, wherein the film thickness of the first silicon oxide film in the laminate structure is controlled to satisfy a withstand voltage required for the laminate structure per se.

6. The vertical MOS device according to claim 1, wherein the silicon nitride film is a deposited film.

7. The vertical MOS device according to claim 1, wherein the laminate structure of the gate insulation film is locally located on the sidewall of the trench, and the gate insulation film comprises a first thick silicon oxide film disposed on the bottom of the trench, the first thick silicon oxide film having a film thickness greater than a film thickness of the laminate structure and covering a corner of the bottom of the trench.

8. The vertical MOS device according to claim 1, wherein the laminate structure of the gate insulation film is locally located on the sidewall of the trench, and the gate insulation film comprises a second thick silicon oxide film disposed on the inlet of the trench, the second thick silicon oxide film having a film thickness greater than a film thickness of the laminate structure and covering an inlet corner of the trench.

9. The vertical MOS device according to claim 7, wherein the laminate structure of the gate insulation film is locally located on the sidewall of the trench, and on the inlet of the trench is disposed a second thick silicon oxide film as the gate insulation film, the second thick silicon oxide film having a film thickness greater than the film thickness of the laminate structure and covering an inlet corner of the trench.

10. A vertical MOS device having a trench gate structure, the semiconductor device comprising:

a semiconductor body having a trench, the trench having an inlet, a sidewall and a bottom;

a gate insulation film disposed to cover the sidewall and the bottom of the trench, the gate insulation film comprising a laminate structure of a first silicon oxide film, silicon nitride film of 10–30 nm in thickness and a second silicon oxide film successively laminated in this order from a trench side; and a gate electrode of a polycrystalline silicon which is doped with boron, the gate electrode filling the trench with the gate insulation film interposed, wherein:

the semiconductor body has a first region of a first conductivity type, a second region of a second conductivity type, and a third region of the first conductivity type vertically aligned along the trench, thereby forming a vertical MOS structure by the gate electrode in the trench, the gate insulation film on the sidewall of the trench, and the first through third region;

the laminate structure of the gate insulation film is disposed to locally cover the sidewall of the trench;

the first silicon oxide film at the trench side in the laminate structure has a film thickness that is greater than a film thickness of the second silicon oxide film at the gate electrode side; and the gate insulation film on the bottom of the trench is a first thick silicon oxide film which has a film thickness greater than a film thickness of the laminate structure, the first thick silicon oxide film covering a corner of the bottom of the trench.

11. The vertical MOS device according to claim 10, wherein the first silicon oxide film in the laminate structure has a film thickness of approximately 100 nm.

12. The vertical MOS device according to claim 10, wherein the inlet of the trench is covered with a second thick silicon oxide film which has a film thickness greater than the film thickness of the laminate structure and covers an inlet corner of the trench.

* * * * *